United States Patent
Bolz et al.

(10) Patent No.: US 10,612,132 B2
(45) Date of Patent: Apr. 7, 2020

(54) COATING A BODY WITH A DIAMOND LAYER AND A HARD MATERIAL LAYER

(71) Applicant: CemeCon AG, Würselen (DE)

(72) Inventors: Stephan Bolz, Aachen (DE); Oliver Lemmer, Aachen (DE); Antonius Leyendecker, Herzogenrath (DE)

(73) Assignee: CemeCon AG, Würselen (DE)

( * ) Notice: Subject to any disclaimer, the term of this patent is extended or adjusted under 35 U.S.C. 154(b) by 126 days.

(21) Appl. No.: 15/778,193

(22) PCT Filed: Nov. 25, 2016

(86) PCT No.: PCT/EP2016/078912
§ 371 (c)(1),
(2) Date: May 22, 2018

(87) PCT Pub. No.: WO2017/089597
PCT Pub. Date: Jun. 1, 2017

(65) Prior Publication Data
US 2018/0347034 A1    Dec. 6, 2018

(30) Foreign Application Priority Data
Nov. 27, 2015  (DE) .................. 10 2015 120 676

(51) Int. Cl.
*C23C 16/27* (2006.01)
*C23C 14/02* (2006.01)
(Continued)

(52) U.S. Cl.
CPC ............ *C23C 16/27* (2013.01); *C23C 14/022* (2013.01); *C23C 16/0281* (2013.01);
(Continued)

(58) Field of Classification Search
USPC ....... 428/216, 325, 336, 408, 697, 698, 699; 204/192.15, 192.16; 427/577
See application file for complete search history.

(56) References Cited

U.S. PATENT DOCUMENTS

| 5,310,596 A | 5/1994 | Bigelow et al. |
| 5,376,444 A | 12/1994 | Grotepass et al. |

(Continued)

FOREIGN PATENT DOCUMENTS

| DE | 694 05 753 T2 | 1/1998 |
| DE | 10 2005 056 937 A1 | 6/2006 |

(Continued)

OTHER PUBLICATIONS

Translation of the International Preliminary Report on Patentability dated May 29, 2018, issued in corresponding International Application No. PCT/EP2016/078912, filed Nov. 25, 2016, 8 pages.

(Continued)

*Primary Examiner* — Archene A Turner
(74) *Attorney, Agent, or Firm* — Christensen O'Connor Johnson Kindness PLLC

(57) ABSTRACT

The invention relates to a coated body and to a method for coating a body. The coated body comprises at least a substrate (22), a diamond layer (24) having a thickness of 1-40 μm, and a hard material layer (26), which is arranged farther outside on the body (10) than the diamond layer (24). The hard material layer (26) comprises at least one metal element and at least one non-metal element. An adhesive layer (32) having a thickness of 2-80 nm is provided between the diamond layer (24) and the hard material layer (26). The adhesive layer (32) contains carbon and at least one metal element. The diamond layer (24) can be applied by means of a CVD method. The hard material layer can be applied by means of a PVD method. The adhesive layer (32) between the diamond layer (24) and the hard material layer (Continued)

(26) can be produced in that, before the hard material layer (26) is applied, the surface of the diamond layer (24) is pretreated by means of HIPIMS metal ion etching, wherein ions are implanted into or diffuse into the surface of the diamond layer (24) by means of metal ion etching.

31 Claims, 1 Drawing Sheet

(51) Int. Cl.
*C23C 16/02* (2006.01)
*C23C 28/00* (2006.01)

(52) U.S. Cl.
CPC .......... *C23C 28/324* (2013.01); *C23C 28/341* (2013.01); *C23C 28/343* (2013.01); *C23C 28/347* (2013.01); *C23C 28/36* (2013.01); *C23C 28/44* (2013.01)

(56) References Cited

U.S. PATENT DOCUMENTS

| | | | |
|---|---|---|---|
| 5,476,333 A | 12/1995 | Matthews | |
| 5,543,210 A | 8/1996 | Kullander et al. | |
| 5,833,021 A | 11/1998 | Mensa-Wilmot et al. | |
| 6,066,399 A | 5/2000 | Hirano et al. | |
| 6,528,115 B1 | 3/2003 | Hirano et al. | |
| 7,195,817 B2* | 3/2007 | Lev | C23C 16/0272 428/408 |
| 7,431,988 B2* | 10/2008 | Hanyu | B23B 51/02 428/216 |

FOREIGN PATENT DOCUMENTS

| | | |
|---|---|---|
| DE | 10 2006 021 994 A1 | 11/2007 |
| DE | 10 2008 021 912 A1 | 11/2009 |
| DE | 10 2010 006 267 A1 | 8/2011 |
| DE | 10 2011 080 898 A1 | 2/2013 |
| EP | 1 182 274 A1 | 2/2002 |
| EP | 1 144 719 B1 | 7/2003 |
| EP | 2 165 002 | 11/2008 |
| JP | 2003-145309 A | 5/2003 |
| WO | 00/60137 A1 | 10/2000 |
| WO | 2004/083484 A1 | 9/2004 |
| WO | 2006/032480 A1 | 3/2006 |
| WO | 2009/132822 A2 | 11/2009 |
| WO | 2011/135100 A1 | 11/2011 |
| WO | 2014/154894 A1 | 10/2014 |
| WO | 2015/163470 * | 10/2015 |

OTHER PUBLICATIONS

International Search Report dated Mar. 20, 2017, issued in corresponding International Patent Application No. PCT/EP2016/078912, filed Nov. 25, 2016, 5 pages.

* cited by examiner

COATING A BODY WITH A DIAMOND LAYER AND A HARD MATERIAL LAYER

The invention relates to a coated body, and a method for coating a body.

It is known to provide bodies, or parts of bodies, with a surface coating for the purpose of improving their properties. Particularly for tools and for components which are subjected to wear, it is known to provide coatings on functional surfaces.

Protection against wear can be achieved, for example, by bodies applied to functional surfaces. It is known e.g. to use sintered bodies comprised of polycrystalline diamond (PCD). For example, U.S. Pat. No. 5,833,021 discloses a cutting element for an earth auger in which a PCD element is sintered onto the cutting surface on a cylindrical hard metal body. To extend the service life, also a hard material layer is applied to the PCD surface. Materials suggested as coating materials are TiN, TiC, TiCN, TiAlCN, TiAlN, $B_4C$, CrN, CrC, ZrC, or one of the transition metals or metals of Group IV, combined with silicon, aluminum, boron, carbon, nitrogen, or oxygen, to form a silicide, aluminide, boride, carbide, nitride, oxide, or carbonitride of a metal. The PCD surface can be pretreated by selective etching or by treatment with reactive metal, e.g. by means of laser sputtering, ion bombardment, or plasma etching. The layer can be applied by means of CVD, MOCVD, PVD, sputtering. In the case of a large difference in the coefficient of thermal expansion between the coating and the PCD layer, intermediate layers can be provided to realize a gradual change in the coefficient of expansion.

DE 10 2010 006 267 A1 describes a method and a layer system for tools with PCD bodies, i.e. synthetically fabricated, extremely tightly assembled masses of diamond crystals, which are produced by a sintering process with a metallic binder material. A PCD base body is generally applied to a hard metal substrate. The PCD surface is activated by high energy, pulsed metal ion beams, and is pretreated by metal ion etching. A reactive-acting, carbide-forming metallic base layer, e.g. comprised of Cr, Ti is applied, then a bonding agent layer, then a hard material cover layer, e.g. TiAlN. A respective transition layer is disposed between the individual layers.

On the one hand CVD processes are known for formation of thin coatings; these involve chemical vapor deposition in which a solid is deposited from the gas phase onto the surface of a substrate. By means of CVD processes, different layers and layer systems can be produced on the surface of a substrate. In this context, synthetic diamond layers, which are deposited from an atmosphere comprised of carbon and hydrogen, play a particular role.

Diamond coatings can be of considerable advantage, especially for use on functional surfaces of components and tools which are subject to wear. They are chemically substantially inert and have extremely high hardness. However, problems can arise in some instances, e.g. in tools with diamond-coated functional surface. At high temperatures, oxidation of the coating may occur. Chemical wear is a possibility, in the machining of, e.g., iron-containing cast materials.

Another class of coatings is formed by PVD coating processes and the layers deposited herewith. Various PVD methods are known, particularly electric arc vapor deposition and sputtering, by which in particular layers of hard material can be deposited onto a substrate.

U.S. Pat. No. 5,543,210 discloses a cutting tool having a body of hard metal or ceramic material, plus a diamond layer, and a layer comprised of chromium nitride, chromium carbide, or chromium carbonitride. The diamond layer can be in direct contact with the coated body or may be separated from said body by a layer of metallic or abrasion-resistant material. The thickness of the diamond layer is 1 to 20 µm, preferably 4 to 15 µm, and the thickness of the chromium-containing layer is 0.1 to 5 µm. The particle size of the diamond layer is preferably 3 to 10 µm. The diamond layer can be produced by a known CVD or PVD coating method. The chromium-containing layer can be applied by any known CVD or PVD method, preferably by ion plating.

JP 2003-145 309 discloses a diamond-coated cutting tool having a base body of hard metal. A diamond layer having a thickness of approximately 20 µm is applied in a microwave CVD apparatus. A TiN layer with a thickness of 0.3 µm is applied by means of arc ion plating and a TiAlN layer with a thickness of about 4 µm is further applied.

The object of the invention is to specify a coated body and a method for coating a body, which have favorable characteristics in particular for tools and components which are subject to wear.

This object is achieved by a coated body according to claim 1 and a method according to claim 27. Advantageous embodiments of the invention are set forth in the dependent claims.

The inventive body comprises a substrate, at least one diamond layer, and at least one hard material layer. According to the inventive method, the body can be coated by first applying a diamond layer by means of a CVD process and then applying a hard material layer above the diamond layer by means of a PVD process.

The substrates are preferably base bodies of a tool or component which is subject to wear, e.g. a component of a bearing. Particularly preferably, it is a cutting tool, particularly with a defined cutting part. The material of the substrate can be, e.g., steel, e.g. HSS steel, sintered hard metal, sintered boron nitride, sintered diamond material, cermet, or ceramic. Preferably substrates of hard metal with sintered tungsten carbide grains in a cobalt-containing matrix material are used.

The inventive body further has a diamond layer, i.e. a layer with at least 75% of the layer volume being comprised of diamond crystals—preferably at least 90%, more preferably at least 95%. The layer is applied at least to a part of the surface of the body, in particular to a functional surface of a tool. Preferably the diamond layer is continuous and enclosed, at least on the functional surface. The diamond layer can be disposed, e.g., directly on the abovementioned substrate material, or one or more intermediate layers can be disposed between the substrate material and the diamond layer. Especially with substrates comprised of steel, an intermediate layer is preferred. In the case of hard metal substrates, it is possible to completely or partially remove substrate constituents, e.g., cobalt, which are unfavorable for layer adhesion, e.g., by means of chemical pretreatment. In the case of an intermediate layer, such chemical pretreatment can be omitted.

The diamond layer can be deposited in a CVD process, particularly preferably a hot-filament process. In the case of the coated body according to the invention, it has a thickness of 1-40 µm, preferably 2-20 µm.

Above the diamond layer, i.e. farther out on the body than the diamond layer, a hard material layer is disposed, according to the invention. The term "hard material layer" is understood to mean a layer comprised of materials of particularly high hardness, e.g. borides, carbides, and nitrides of metals selected from the group comprising Al, Si, and metals of Groups 4-6 of the Periodic System according to IUPAC (2013). Hard materials include un-doped or metal-doped DLC, alumina, cubic boron nitride (c BN), and boron carbide ($B_4C$).

One or more layers can be provided which are disposed between the hard material layer and the diamond layer. In particular, in the inventive coated body, an adhesive layer having a thickness of 2-80 nm is provided in order to improve the adhesion of the hard material layer to the diamond layer.

According to the invention, the hard material layer has at least one metallic element and at least one non-metallic element. In particular, it can be comprised of one or more metallic elements and one or more non-metallic elements. Preference is given to compositions in which the metallic element or the metallic elements are selected from the group comprising Al, Si, and elements of Groups 4 to 6 of the Periodic System according to IUPAC (1988).

Particularly preferred as a metallic element is Ti. The nonmetallic elements can be selected, e.g., from the group comprising B, C, N and O, preferably from the group comprising C and N; particularly preferably, N is provided as the sole non-metallic element.

The hard material layer can be formed in one layer or with a plurality of sublayers, wherein different superimposed sublayers can differ from each other in their composition and/or structure.

In the following descriptions, the compositions of layers are referred to either directly as chemical compounds or phases, or as material systems. Material systems are designated by listing the elements contained therein, each successive pair of elements being separated by a hyphen, with the metallic elements appearing first, followed by the non-metallic elements. Preferably, with this, the metallic and non-metallic elements appear in the sequence in order of their proportion (in atomic percent). The designation of the material system can correspond to the chemical compound, but this rule is not adhered to in all cases. For example, the material system Ti—C will contain or completely consist of the hard material compound TiC, whereas the material system Ti—B comprises or consists of the hard material compound $TiB_2$, and the material system Cr—C can be, e.g. a mixture of the hard material compounds $Cr_{23}C_6$, $Cr_7C_3$, and preferably $Cr_3C_2$.

The entire hard material layer, or at least one of the sublayers, can preferably be comprised of a material system selected from the group comprising Ti—Al—N, Ti—N, Ti—C—N, Ti—Al—C—N, Ti—Al—Si—N, Ti—Si—N, Al—Cr—N, Al—Cr—Si—N, Ti—Ta—N, Ti—B. Also, one or more sublayers of the hard material layer can be comprised of DLC, without or preferably with metal doping. The hard material layer preferably contains a high proportion of the hard material compounds formed in the respective material system, e.g. metal nitrides or metal carbides.

The thicknesses of individual sublayers are, e.g., in the nanometer range, preferably 0.5-30 nm, more preferably 0.5-15 nm, particularly preferably 0.5-5 nm. In one embodiment, the hard material layer has a nano-multilayer structure, i.e. it is comprised entirely of individual sublayers, each of which has a thickness in the above-stated range. In other embodiments, the thickness of all or individual sublayers can also be in the micrometer range. Thus, e.g., a 1-2 μm thick layer of Ti—Al—N can be well protected against oxidation by an overlying layer of Ti—Si—N which is 1-2 μm thick.

With the preferred production of the hard material layer in the PVD process, a layer results which, unlike a layer fabricated by a CVD process, has compressive stresses and is free from contamination by halogens. Particularly preferred is a hard material layer produced in a sputtering process, which, in contrast to a layer fabricated by electric arc vapor deposition, is free of droplets.

The overall thickness of the hard material layer is preferably in the micrometer range. Preferably, the layer thickness of the hard material layer is less than the layer thickness of the diamond layer, e.g. at least 20% less, preferably at least 40%, particularly preferably at least 60% less. Preferably, the overall thickness of the hard material layer can be 1-12 μm, more preferably, 2-6 μm.

The inventive layer structure with a hard material layer above a diamond layer can afford substantial advantages, particularly with use as a tool. Oxidation-resistant hard material layers, such as, e.g., Ti—Al—N, Ti—Al—Cr—N, Cr—N, and $Al_2O_3$, can reduce or prevent contact of the diamond layer with oxygen, e.g. when the coated body is used as a tool, so that even at higher temperatures oxidation of the diamond layer is reduced or completely avoided. Also, doping the hard material layer or one or more sublayers of it with Si can improve the oxidation resistance. Examples of such layers would be Ti—Si—N, Ti—Al—Si—N, Cr—Al—Si—N, or multilayer structures with, for example, alternating sublayers comprised of Ti—Al—N and Ti—Si—N. Similar advantages also result when using a tool with the inventive structure for machining of materials containing Fe, Co, and/or Ni, in particular steel and iron-containing cast materials. The hard material layer provided according to the invention above the diamond layer, in particular if the hard material layer is in the form of a nitride, carbide or carbonitride, e.g. as Ti—Al—N or Al—Ti—Cr—N, can at least partially protect the diamond layer from chemical wear.

In general, the layer structure of a diamond layer and a hard material layer disposed farther outward is favorable, because the diamond layer with its extremely high hardness and high modulus of elasticity forms an extremely stable and hard substructure for the hard material layer applied over it. This arrangement can serve to prevent an "eggshell effect," namely breakthrough of the PVD layer under heavy mechanical loads.

It is also possible for the substructure in the form of the diamond layer to achieve reduction of the thermal load on the PVD layer and the substrate, e.g. when the coated body is employed as a cutting tool. As a result, the service life of the PVD layer can be increased, and plastic deformation of the substrate, as well as displacement of cutting edges, can be reduced or avoided. A reduction of the thermal load can be achieved by the good thermal conductivity of the diamond layer. This can reach values up to the extraordinarily high thermal conductivity of natural diamond of 2100 W/Km. Depending on the layer structure of the diamond layer, which, as will be explained in more detail below, can be comprised of a plurality of sublayers of diamond of different structures, it is also possible that lower values of thermal conductivity can result. The reduction in thermal conductivity results from grain boundaries of the individual diamond crystals. Particularly in the case of nanocrystalline diamond layers or sublayers, the large number of grain boundaries results in lower thermal conductivities, which, however, can still have a favorable influence on the thermal conditions in the hard material layer. Preferably, an average thermal conductivity of greater than 120 W/Km is achieved in the diamond layer, preferably higher than 200 W/Km, particularly preferably higher than 500 W/Km. The thermal conductivities have been found to be significantly temperature-dependent; the values given are to be understood to be thermal conductivity at room temperature.

The inventive layer structure can be particularly advantageous as regards roughness. In many cases it is not possible to avoid a roughness of the surface of the diamond layer, because a certain roughness is needed in the region of the interface between the substrate and the diamond layer, which leads to interlocking and enables better adhesion. However, excessive roughness of the outer surface of the diamond layer can lead to increased friction and a poor surface finish of machined workpieces. The hard material layer can be instrumental in reducing the roughness immediately after the fabrication, or at least during use, if the hard material layer compensates for the roughness of the diamond layer. In use, it is favorable that hard material layers, which have less hardness than diamond, wear faster at roughness peaks of the diamond layer, while tending to persist in roughness valleys. Thus, the hard material layer can cause an evening out of the surface of the diamond layer.

Reduced surface roughness is particularly important to the functional surface of tools. In the machining of materials by means of tools, such as drills, milling cutters, etc., a smoother surface will greatly reduce the noise which is generated. For example, in machining of fiber composite materials using a drill with a rough, diamond-coated cutting edge, noises in the form of loud squeaking can be generated. With a drill according to the invention, which has an outer hard material layer, the noise which is produced can be significantly reduced.

For purposes of evening out of roughness which may be present in the diamond layer, it can be preferred to select the thickness of the hard material layer based on the roughness of the diamond layer, quantified as the mean roughness depth, $R_z$. E.g., the thickness of the hard material layer can be chosen to be between one half of the roughness $R_z$ of the diamond layer and two times the roughness $R_z$ of the diamond layer.

The properties of the outer surface of the fabricated body can also be improved by hard material layers which are in fact relatively soft, for example hard material layers comprised of materials such as metal-doped DLC or lubricating layers such as $MoS_2$, which can improve the sliding properties and can fill roughness valleys, which then act as a reservoir for a lubricating layer. Corresponding tools are particularly advantageous for dry machining. In cases where the thermal stability of the aforesaid lubricating layers is insufficient, layer materials such as Ti—C—N or Ti—Al—C—N are more suitable.

Another possible advantage of the combination of the different layers can be achieved by means of the different layer stresses. In general, diamond layers produced by CVD on tool substrates have compressive stresses resulting primarily from different coefficients of thermal expansion of the diamond material and the substrate material. Hard material layers which are achieved by PVD methods, in particular sputtering methods, likewise have compressive stresses which result from ion bombardment during the application of the coatings. With suitable choice of the coating temperatures, as well as materials and thicknesses that are matched to each other, arrangements can be achieved with which, by means of the hard material layer, the resulting stresses in the diamond layer can be reduced.

The inventive layer system comprised of two very different layers can also be advantageously used for wear detection. In particular, bright and color-intensive hard material layers, for example Ti—N or Cr—N, can stand out clearly from the mostly dark and in the case of wear partially graphitized diamond material when used as a tool, and thereby its wear will be rendered readily visible.

Tools designed according to the invention can be used in particular for cutting and machining. Particular advantages arise during machining of, e.g., composites, preferably fiber-reinforced composite materials, where layers comprised of Ti—Si—N, Ti—B, and layers comprised of a plurality of sublayers comprised of Ti—Al—N and Ti—Si—N are advantageous. Also, for cutting, preferably machining, of aluminum-silicon alloys, tools having the inventive structure have been found to be favorable, in particular if they contain Ti—B as a layer. Further applications are, e.g., cutting tools for machining of steel or iron-containing cast alloys, cutting tools for dry machining.

According to a further development of the invention, the diamond layer can have at least one sublayer which at least predominantly, i.e. to the extent of more than 50% of the layer volume, preferably to the extent of more than 80% of the layer volume, consists of nanocrystalline diamond having a particle size of 100 nm or less. E.g., the diamond layer can be comprised entirely of one layer of nanocrystalline diamond, or several sublayers of diamond can be provided, wherein the material of the sublayers differs, e.g., with respect to the particle size and/or to the volume fraction of diamond crystals in relation to the layer volume.

Nanocrystalline diamond having a particle size of 100 nm or less, preferably less than 50 nm, particularly preferably less than 10 nm, can form very smooth layers. A method for producing nanocrystalline diamond layers by changing between different operating states in a CVD process is disclosed in, e.g., WO 2004/083484 A1. The contents of that document with regard to the fabrication method and the layers obtained are explicitly incorporated herein by reference.

The diamond layer can also have at least one sublayer which is comprised at least primarily of diamond having a particle size greater than 100 nm. For the sake of simplicity, such a diamond layer, or such a sublayer within a multilayer diamond layer, will be referred to herein as microcrystalline diamond; this is to be distinguished from nanocrystalline diamond. Preferably, such a diamond layer, or diamond sublayer, comprised of microcrystalline diamond has a particle size greater than 500 nm, more preferably a particle size greater than or equal to one micrometer.

Particularly preferred are multilayer diamond layers, particularly such layers which comprise at least one sublayer which is comprised primarily of nanocrystalline diamond and at least one sublayer which is comprised primarily of microcrystalline diamond. In this case, the two sublayers differ both in particle size and in volume fraction of diamond crystals. With smaller particle sizes, particularly of nanocrystalline diamond, the proportion of the particle boundaries to the volume fraction is higher. Therefore, a layer consisting entirely of nanocrystalline diamond contains a higher proportion of carbon that is not sp3-bonded. Nanocrystalline layers also have lower roughness; on the other hand, microcrystalline layers have better thermal conductivity. A multilayer layer having sublayers with a nanocrystalline structure and sublayers with a microcrystalline structure leads to lower crack propagation.

Multilayer diamond layers having, e.g., 2-12 sublayers, are preferred.

Multilayer diamond layers in which the sublayers differ from each other in various parameters such as particle size and proportion of diamond content are disclosed in WO 00/60137 of the applicant. The fabrication methods and the layer structures obtained thereby, which are disclosed therein, are explicitly incorporated herein by reference.

In the multilayer diamond layer, a sublayer, preferably each individual sublayer in the diamond layer, can have a thickness of, e.g., 1-5 µm. Multilayer structures in which each sublayer has a thickness in the range 0.25-2.5 µm are preferred. Particularly preferred are structures with very thin sublayers in the range of 0.5-1.5 µm.

A very wide range of sequences of sublayers can be formed within a multilayer diamond layer. A structure is preferred in which two types of sublayers are disposed alternately in succession, e.g. a first type of a sublayer A which is primarily comprised of nanocrystalline diamond and a second type of a sublayer B which is primarily comprised of microcrystalline diamond, in an alternating structure of the form A B A B . . . .

In a layer structure of the diamond layer with different sublayers, preferably the outermost sublayer of the diamond layer consists predominantly of nanocrystalline diamond. With this arrangement, a particularly smooth layer surface is achieved. At the same time, preferably the innermost sublayer of the diamond layer, which is in contact with the substrate or the intermediate layer, consists at least predominantly of microcrystalline diamond. A microcrystalline sublayer of the diamond layer has been found to have better adhesion. In particular, it is preferred for the innermost sublayer of the diamond layer to have a thickness of 3 µm or less, particularly preferably even less, e.g. 2 µm or less, or even 1.2 µm or less.

According to a preferred embodiment, the diamond layer is electrically non-conductive. This is the case with an un-doped diamond layer or with very low doping, e.g. with less than 0.05 at-% boron.

The hard material layer can be deposited directly onto the diamond layer, preferably in a PVD method, particularly preferably by means of magnetron sputtering.

In addition to the adhesive layer provided in the coated body according to the invention, a transition layer can also be provided between the diamond layer and the hard material layer. The adhesive layer or the transition layer can be in direct contact with the diamond layer and/or the hard material layer, but differ in its structure and/or composition from the hard material layer and/or the diamond layer. In particular, the adhesive layer can have a smaller proportion of hard material compounds than the transition layer and/or the hard material layer.

An adhesive layer comprising carbon and at least one metallic element is provided in the inventive coated body between the diamond layer and the hard material layer. In particular, the adhesive layer can directly adjoin the diamond layer. One or more metallic elements can be provided in the adhesive layer, in particular selected from the group comprising Ti and Cr. At least one metallic element of the adhesive layer can preferably also be an element of the hard material layer or of the transition layer.

According to the inventive method, the adhesive layer is formed by implantation of metal atoms in an outer zone of the diamond layer. According to the inventive method, this is accomplished by an HIPIMS etching method, in which metal ions are implanted in the surface of the diamond layer.

The adhesive layer can have, e.g., at least the elements Ti and C. Particularly preferred is an adhesive layer which contains Ti, Cr, or both elements, and which is formed directly on the diamond layer. Preferably the adhesive layer has primarily Ti and C, i.e. in the amount of more than 50 at-%, more than 90 at-%; and particularly preferably the adhesive layer is comprised of Ti and C. It is also preferred for the adhesive layer to contain the hard material compound TiC.

In the inventive coated body, the adhesive layer has a thickness of 2-80 nm, preferably 5-40 nm. Preferably the concentration of at least one metallic element, preferably of all metallic elements in the adhesive layer has a gradient increasing with the distance from the substrate; thus, the metal content increases with progression in the outward direction. For example, adhesive layers are preferred in which the concentration of Ti and/or Cr has a gradient which increases with the distance from the substrate; wherewith the concentration of Ti and/or Cr directly in contact with the diamond layer is relatively low, but preferably it increases continuously. In this way, a good transition between the diamond layer and the hard material layer or the transition layer is provided, particularly in the case of a hard material layer or transition layer which has Ti and/or Cr as constituents.

By means of an adhesive layer, good anchoring in the diamond layer can be achieved. This is beneficial for the transition to the hard material layer or a transition layer. In addition, the diamond layer is conductive as a result of the introduction of metallic elements, so that subsequent sputtering methods can be easily employed. The outer side of the adhesive layer is preferably formed predominantly by a hard material compound, e.g. TiC or $Cr_3C_2$.

A transition layer between the diamond layer and the hard material layer, or between the adhesive layer and the hard material layer, can, for example, contain at least one metallic element and one non-metallic element. The transition layer preferably differs in composition from the hard material layer.

The transition layer can contain, for example, at least one, preferably a plurality of the elements Si, V, W, Ti, Cr, C, or N. Preferably, it contains C and/or N as non-metallic elements and Ti and/or Cr as metallic elements. Particularly preferred is a transition layer that contains Ti as one of the metallic elements or as the only metallic element.

For example, the transition layer can contain Ti—N, Ti—C, Ti—C—N, Cr—C, Cr—C—N, or Cr—N, or can be primarily or fully comprised thereof. Ti—C is particularly preferable. These material systems have been found to be particularly suitable for achieving a good transition from the diamond layer or adhesive layer to the hard material layer. The transition layer is comprised preferably primarily of hard material compounds, preferably to an extent over 70 vol-%, particularly preferably to an extent over 90 vol-%. Preferably, the proportion of hard material compounds in the transition layer is higher than in the adhesive layer.

A transition layer can, for example, have a thickness of 0.1-2 µm, preferably 0.5-1.5 µm.

In preferred embodiments, the thickness of the transition layer or the adhesive layer, or the sum of the thicknesses of the adhesive and transition layer can be chosen depending on the roughness of the diamond layer. Preferably, this thickness can be smaller than the value of the surface roughness Rz of the diamond layer. Thus shear planes in the layers can be avoided in particular during use as a tool, for example for machining.

The structure and composition of the transition layer can be constant and homogenous over the thickness. However, it is preferred that the composition varies over the thickness. Preferably, the concentration of non-metallic elements in the transition layer can vary. It is hereby preferred that the concentration of carbon is higher closer to the diamond layer, while the concentration of non-metal elements of the hard material layer is higher closer to the hard material layer. Furthermore, the concentration of non-metallic elements in the transition layer can vary so that it continuously changes over a part of the thickness or over the entire layer thickness of the transition layer in that, for example, a graduated TiCN sublayer is located between a TiC sublayer and a TiN sublayer.

The transition layer can have at least one sublayer that comprises carbon, nitrogen and at least one metallic element. In particular, the transition layer can comprise a first sublayer with carbon, nitrogen and one or more metallic elements and a second sublayer comprised of a nitride of the metallic element(s) distanced farther from the substrate. Transition layers are hereby preferred that have Ti as the only metallic element (e.g. Ti—C, preferably Ti—C—N or Ti—N), or that have Cr as the only metallic element (e.g. chromium carbide, in particular $Cr_2C_3$, Cr—C—N or Cr—N), or that have both Ti and Cr as metallic elements.

Preferably, an adhesive layer can be formed by atoms of one or more metallic elements of the hard material layer or transition layer implanted and/or diffused into the diamond layer in the outer region, for example of at least one of the elements Cr, Al, and Ti, particularly preferably Ti. Implantation and excitation of atoms is in particular possible with an ion pretreatment with sufficient bias voltage, through which ionized atoms are accelerated towards the diamond layer as substrate and are implanted there and/or diffuse in. The implantation and/or diffusion results in a particularly advantageous adhesive layer as an interface region between the diamond layer and the hard material layer or between the diamond layer and a transition layer. With regard to the method, it is preferred to pretreat the surface of the diamond layer by means of HIPIMS metal ion etching before applying the hard material layer or transition layer. This can achieve a particularly close layer bond with good mechanical properties and good layer adhesion. HIPIMS metal ion etching allows in particular favorable implantation, diffusion and activation of the ions in the region of the diamond layer close to the surface so that the formation of an adhesive layer is possible. For metal ion etching, one or more magnetron cathodes can be operated as a HIPIMS electrode. HIPIMS (high power impulse magnetron sputtering), also HPPMS (high power pulsed magnetron sputtering), provides the operation of at least one magnetron cathode with very short, very energetic pulses, wherewith a high ionization density is achieved. A low ratio between the pulse duration and the pulse pause of under 0.1, i.e., that the pulse pause is more than 10 times as long as the pulse duration, is characteristic for the HIPIMS operation. Devices and methods for operation of magnetron cathodes via HIPIMS are, for example, disclosed in WO 2009/132822 A2 of the applicant. The operating modes, electrode configurations and definitions mentioned therein, in particular regarding HIPIMS, or respectively HPPMS, operation, are explicitly incorporated herein, as well as the information on ion etching and ion implantation in this operating mode.

By implanting and/or diffusing ions into the diamond layer and/or atomizing the diamond layer, metal carbides can be formed. For example, with Ti ions titanium reacts to titanium carbide (TiC) and a graduated adhesive layer results.

A careful selection of the bias voltage is useful in the case of ion etching as well as in the case of coating by means of magnetron sputtering so that charges or arc discharges do not occur on the non-conductive diamond layers. While, in the case of conductive layers, a bias voltage of, e.g., 1000V can be chosen, in the case of non-conductive diamond layers a lower bias voltage of, e.g., 200-400V, preferably 250-350 volts is recommended at least at the beginning of the treatment. The mentioned bias voltages are to be understood as having the negative pole on the substrate. After the formation of a conductive adhesive layer, magnetron sputtering can be continued as with conductive substrates. Doping the diamond layer, e.g., with boron, with which an electrical conductivity can be achieved, is therefore not necessary. Thus the effort is decreased and contamination of the coating apparatus with boron and influences of boron on the diamond layer avoided.

In one embodiment, a carbide layer, for example a TiC layer, can be produced reactively on the diamond layer as a first sublayer of a transition layer by adding a carbon-containing reactive gas. Then, by changing to a nitrogen-containing reactive gas, a nitride layer, for example a TiN layer, can be deposited as a second sublayer of a transition layer. A graduated transition from a carbide sublayer to a nitride sublayer via a carbonitride intermediate sublayer is also preferred here, for example from Ti—C to Ti—N via a Ti—C—N intermediate sublayer. Almost any of the aforementioned hard material layers, in particular nitride layers such as Ti—Al—N, can be applied to the transition layer formed in this manner with an outermost nitride sublayer, especially Ti—N.

Alternatively to the use of Ti, Cr can also be used. Then, just as described above as an example for Ti, for example first Cr ions can be implanted and/or diffuse into the diamond layer. This is useful, for example in the case of a Cr-containing hard material layer. Combinations with Ti and Cr are also possible. Metals such as Ti, W, Ta can also be used individually or in combination.

Particularly preferably, the hard material layer can be applied by means of magnetron sputtering, wherein preferably at least one magnetron cathode is operated according to the HIPIMS method. In this case, the hard material layer can be produced exclusively with one or more HIPIMS cathodes, or the HIPIMS cathode is used together with other cathodes, for example UBM cathodes in DC operation, to apply the hard material layer.

The HIPIMS method can also be used to produce an intermediate layer between the substrate and the diamond layer. The intermediate layer can also here be completely produced by means of HIPIMS coating and/or by means of simultaneous operation of at least one HIPIMS cathode with further cathodes. Alternatively or in addition, the substrate can be pretreated before the application of the intermediate layer by means of ion etching, wherein the ions are produced by at least one magnetron cathode that is operated according to the HIPIMS method.

Both the pretreatment of the diamond layer by means of HIPIMS metal ion etching and the subsequent production of the hard material layer or previous production of an intermediate layer can preferably be accomplished in a multi-cathode magnetron sputtering apparatus, in particular with multiple unbalanced magnetrons that can be individually selectively operated conventionally or by means of HIPIMS. Thus the inventive production of the adhesive layer by means of HIPIMS metal ion etching can be accomplished in that at least one magnetron cathode is operated in the HIPIMS operating mode. It is thereby possible that none or only a small layer of growth takes place, wherein the production of the adhesive layer is accomplished by transforming the uppermost zone of the diamond layer.

The pretreatment leads to an activation of the diamond surface, to an implantation or diffusion of metal atoms, and to the formation of metal carbides. In this case the diamond layer itself can be atomized to a small proportion. On the other hand, carbon-containing gases such as $CH_4$ or $C_2H_2$ can additionally be supplied.

At least one magnetron cathode can also be operated in the HIPIMS operating mode in the case of the subsequent production of the hard material layer or an intermediate layer. In contrast to the pretreatment by means of metal ion etching, higher layer rates are striven for in this case. For this, inert gases such as argon and krypton are also preferably introduced in addition to reactive gases.

In multi-cathode magnetron sputtering apparatuses, the individual cathodes can also be operated in mixed operation, partially conventionally and partially in the HIPIMS operating mode.

In comparison to arc-based PVD methods, such as arc ion plating (AIP), in the case of the sputtering method no droplets occur in the layers. A small incorporation of sputtering gases into the layer takes place, however. The inert gas proportion in the layer can, for example, generally be between 0.1 and 0.5 atomic percent.

A reduction of the inert gas proportion in a hard material layer produced in the HIPIMS method can, for example, be accomplished by increasing the number or the output of the HIPIMS cathodes. Preferably, a reduction can be achieved in that, during the coating, no constant bias voltage is applied to the substrate, but rather a pulsed bias voltage that preferably has bias pulses synchronized with the HIPIMS pulses. An HIPIMS method with such synchronized bias pulses is described in WO 2014/154894 A1, which is explicitly referred to here. The inert gas proportion in the layer can be reduced to, for example, 0.01-0.1 atomic percent in particular by means of synchronous but temporally offset to the HIPIMS pulses bias pulses with which a bias voltage is applied at the times in which the metal ion density is particularly high during the HIPIMS pulses. The hard material layer can in this way, for example, depending on the type of fabrication, have an inert gas proportion of 0.01 to 0.5 atomic percent.

Typical values for the HIPIMS parameters are mean outputs of, for example, 2.27 to 22.7 W/cm$^2$ of the target surface, meaning, for example, an output of 1000-10,000 W for each target with a surface of, for example, 440 cm$^2$. The pulse duration preferably used in the HIPIMS method can, for example, be 10-200 µs. The HIPIMS pulses can preferably be produced with frequencies of, e.g., 100-10,000 Hz. Preferred values for the pressure in a coating chamber can, for example, be 100-1000 mPa.

In the preferred case of the use of synchronized bias pulses, the same frequency is chosen for the bias pulses in the case of HIPIMS frequencies over 1000 Hz; below 1000 Hz and in the case of a number N of HIPIMS cathodes operated temporally offset, the N-times the frequency is preferred for the bias pulses. The offset for the bias pulses for more effective capture of the metal ions can, for example, be 10-120 µs in the case of pulse lengths of maximally 200 µs. The bias voltages can, for example, be 10-1200 V.

As an intermediate layer between the substrate and the diamond layer, a metallic intermediate layer is preferred. This can particularly preferably be comprised of at least predominantly of atoms of the elements Cr, W and/or Ti. Examples of this are disclosed in WO2011/135100 of the applicant and in this regard are explicitly incorporated herein.

Embodiments of the invention are described in more detail hereinbelow with reference to the drawings. In the drawings.

Figure 1:
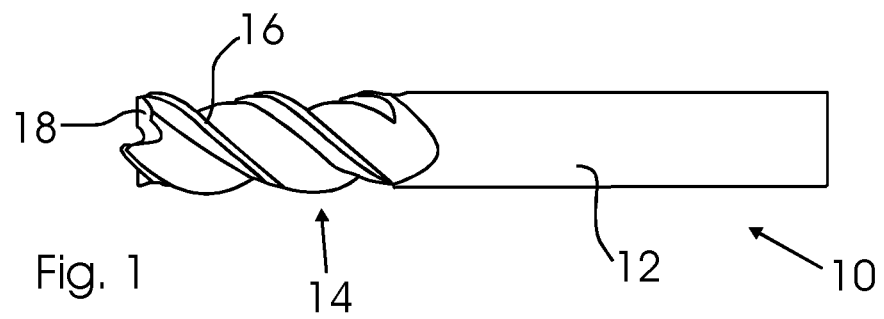
FIG. 1 is a lateral view of a coated tool according to an embodiment of the invention.

FIG. 1 is a lateral view illustrating an end milling cutter 10 with a shank 12 and a cutting part 14. The cutting part 14 comprises main teeth 16 and end teeth 18. Both form functional surfaces of the tool 10.

In the exemplary embodiment, the body of the cutter 10 is comprised of hard metal, in particular sintered tungsten carbide grains in a cobalt matrix. At least the cutting part 14 is provided with a coating having a layered structure which will be described below.

Figure 2:
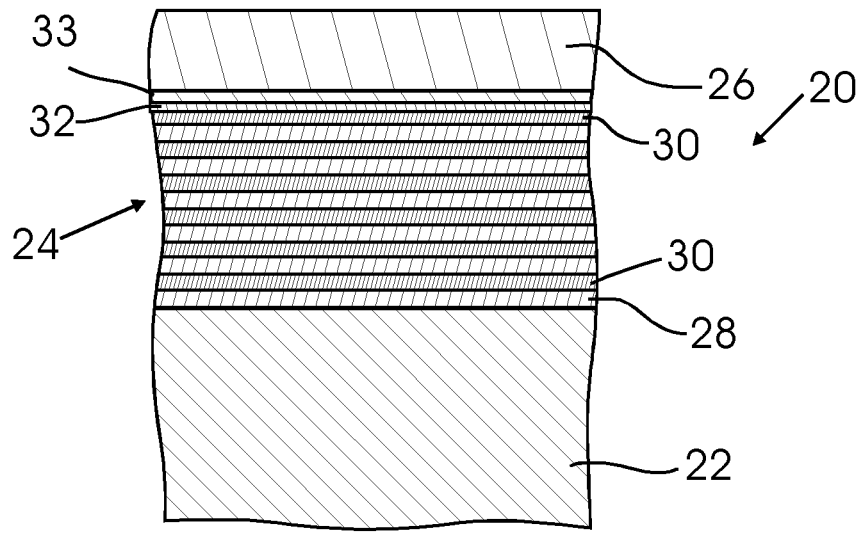
FIG. 2 is a schematic cross sectional view of a layer structure corresponding to a first embodiment.

FIG. 2 is a schematic cross sectional view of a layer structure according to a first embodiment 20. The hard metal substrate 22 is illustrated only partially, in the lower region. In the example illustrated, a diamond layer 24 is disposed directly on said substrate. A hard material layer 26 is formed above the diamond layer 24.

In the example illustrated, the diamond layer 24 is comprised of a plurality of sublayers, alternating between sublayers of microcrystalline diamond 28 and of nanocrystalline diamond 30. A first sublayer 28 of microcrystalline diamond is disposed directly on the substrate 22, a sublayer 30 of nanocrystalline diamond is disposed above said sublayer 28, and so forth. The outermost sublayer 30 of the diamond layer 24 is a nanocrystalline sublayer.

The hard material layer 26 is disposed above the diamond layer 24, with an adhesive layer 32 and a transition layer 33 being formed between these layers.

The hard material layer 26 in the example illustrated is a single layer comprised of Al—Ti—Cr—N.

In the example, the adhesive layer 32 is in the form of a Ti—C layer, with Ti atoms being implanted and/or diffused into the surface of the diamond layer 24 by HIPIMS etching.

The transition layer 33 has an inner hard material sublayer of reactively deposited TiC, an outer sublayer of reactively deposited TiN, and a transition zone of TiCN between these (not shown).

The tool 10 with the coating on the cutting part 14 according to the illustrated layer structure 20 has been found to be particularly suitable for machining fiber-reinforced composites, aluminum-silicon alloys, and steel- or iron-containing cast alloys. The Al—Ti—Cr—N hard material layer 26 is hereby firmly anchored to the diamond layer 24. Due to the presence of the hard material layer 26, the hard diamond layer 24 is isolated from direct contact with the machined material, so that chemical wear is minimized. A remaining roughness of the diamond layer 24 is leveled out by the hard material layer 26. In the machining process of the mentioned materials, the thermal load is limited by the good thermal conductivity of the diamond layer 24.

To fabricate the tool 10, the diamond layer 24 is first applied to the hard metal substrate 22 in a hot-filament CVD process, as described, for example, in WO 00/60137, following sufficient pretreatment. The nanocrystalline sublayers 30 can be produced using a method according to WO 2004/083484 A1.

Above the diamond layer 24, the adhesive layer 32 is then formed on the surface of the diamond layer 24. This is carried out in a PVD apparatus. After heating the substrates and ion etching with Ar ions with pulses in the middle frequency range, the surface of the diamond layer 24 is first treated by ion etching with Ti ions produced by HIPIMS, for example in an apparatus according to WO 2009/132822 A2. In this process, Ti ions which are produced from a Ti target of a magnetron cathode operated via HIPIMS are accelerated toward the tool 10 by a bias voltage of approximately 300 V and are thus introduced into the surface of the diamond layer 24.

After approximately 30 minutes, a conductive adhesive layer of Ti—C approximately 20 nm thick has formed. This formation may be brought about by diffusing the high-energy and very reactive Ti ions or atoms, and/or by implantation of the Ti ions. The reaction can be further promoted by sputtered and excited carbon atoms of the material of the diamond layer 24. Analysis with XPS has shown that the Ti—C adhesive layer contains the hard material compound TiC. By means of this treatment, the surface, which, in the form of the un-doped diamond layer was previously electrically non-conductive, becomes electrically conductive and can more easily be treated with further sputtering processes.

Through addition of argon as a process gas and of a carbon-containing reactive gas, e.g. $C_2H_2$, and through reduction of the bias voltage, a transition layer 33 is formed, in that a TiC layer is first deposited.

Subsequently, the supply of the carbon-containing gas is continuously reduced, while nitrogen is supplied to an increasing degree, as a reactive gas. Thus, an outer TiN sublayer is formed, and TiCN is formed between the inner and outer sublayer of the transition layer 33. Thus, in the transition layer 33, both of the non-metallic elements N, C have concentrations which vary in the thickness direction, wherein in the direction upward from the substrate, the carbon content continuously decreases and the nitrogen content continuously increases.

Then, the Al—Ti—Cr—N hard material layer 26 is applied to the adhesive layer 32 by means of reactive magnetron sputtering, with nitrogen being supplied.

Figure 3:
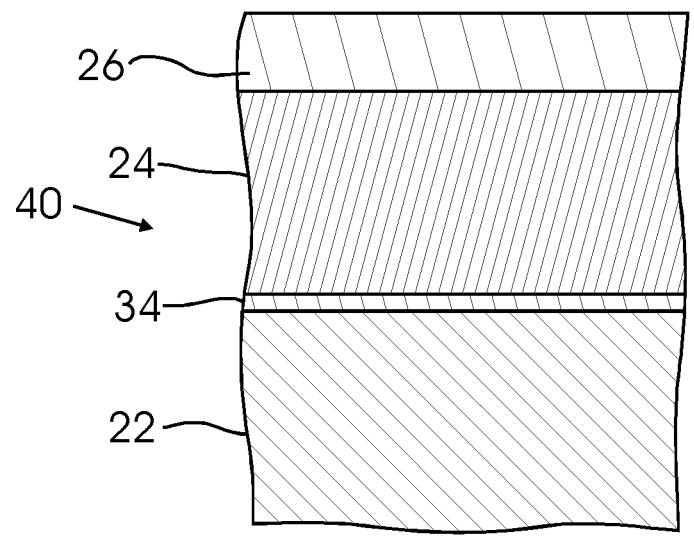
FIG. 3 is a schematic cross sectional view of a layer structure corresponding to a second embodiment.

FIG. 3 is a schematic representation of a layer structure 40 according to a second embodiment. Similarly to the layer structure 20 according to the first embodiment, this comprises a diamond layer 24 above the substrate 22, and a hard material layer 26 above the diamond layer 24.

In contrast to the first embodiment, the structure of the diamond layer 24 here is a single-layer. An adhesive layer 32 (not shown) is provided between the diamond layer 24 and the hard material layer 26, but no transition layer 33 is provided.

The layer structure 40 according to the second embodiment further differs from the layer structure 20 according to the first embodiment by the presence of an intermediate layer 34 which is formed on the surface of the substrate 22 and is disposed between the substrate 22 and the diamond layer 24. The intermediate layer 34 is a predominantly metallic intermediate layer comprised of Cr.

In fabricating the layer structure 40 according to FIG. 3, first the intermediate layer 34 is produced in a magnetron sputtering process with at least one Cr target. Then, first the diamond layer 24 and then the adhesive layer 32 and the hard material layer 26 are applied to the thus formed intermediate layer 34, as described above for the layer structure 20.

The invention claimed is:
1. A coated body, comprising at least the following:
a substrate;
at least one diamond layer having a thickness of 1-40 μm; and at least one hard material layer, which is disposed farther outside on the body than the diamond layer, wherein the hard material layer comprises at least one metallic element and at least one non-metallic element;
wherein an adhesive layer having a thickness of 2-80 nm is provided between the diamond layer and the hard material layer, which adhesive layer contains carbon and at least one metallic element.
2. The coated body according to claim 1, in which the concentration of at least one metallic element in the adhesive layer has a gradient increasing with the distance from the substrate.
3. The coated body according to claim 1, in which the adhesive layer is formed by implantation or diffusion of metal atoms in an outer zone of the diamond layer.
4. The coated body according to claim 1, in which the metallic element or the metallic elements of the adhesive layer are selected from a group comprising Ti and Cr.
5. The coated body according to claim 1, in which the adhesive layer is comprised primarily of Ti and C.
6. The coated body according to claim 1, in which the adhesive layer has a thickness of 5-40 nm.
7. The coated body according to claim 2, in which the concentration of all of the metallic elements in the adhesive layer has a gradient increasing with the distance from the substrate.
8. The coated body according to claim 1, in which the adhesive layer contains one or more of the metallic elements of the hard material layer and/or of a transition layer.
9. The coated body according to claim 1, in which a transition layer is provided between the diamond layer and the hard material layer, which transition layer contains at least one metallic element and at least one non-metallic element.
10. The coated body according to claim 9, in which the transition layer is provided between the adhesive layer and the hard material layer.
11. The coated body according to claim 9, in which the transition layer contains at least one of the elements Si, V, W, Ti, Cr, C, or N.
12. The coated body according to claim 9, in which the transition layer contains Ti—N, Ti—C—N, Ti—C, Cr—C, Cr—C—N, or Cr—N, or is comprised entirely or primarily of same.
13. The coated body according to claim 9, in which the concentration of at least one non-metallic element in the transition layer varies along the thickness direction.
14. The coated body according to claim 9, in which the adhesive layer has a lower proportion of hard material compounds than the transition layer and/or the hard material layer.
15. The coated body according to claim 1, in which the diamond layer has at least one sublayer which is comprised at least primarily of nanocrystalline diamond having a particle size of 100 nm or less.
16. The coated body according to claim 1, in which the diamond layer has at least one sublayer which is comprised at least primarily of diamond having a particle size greater than 100 nm.
17. The coated body according to claim 15, in which the diamond layer comprises a plurality of sublayers comprised of diamond,
wherein at least two sublayers differ as to the particle sizes and/or the volume fraction of diamond crystals.

18. The coated body according to claim 15, in which in the diamond layer, two types of sublayers are disposed in alternating sequences, in a plurality of instances.

19. The coated body according to claim 17, in which the outermost sublayer of the diamond layer is comprised primarily of nanocrystalline diamond having a particle size of 100 nm or less.

20. The coated body according to claim 17, in which the innermost sublayer of the diamond layer is comprised primarily of diamond having a particle size greater than 100 nm.

21. The coated body according to claim 20, in which the innermost sublayer of the diamond layer has a thickness of 3 μm or less.

22. The coated body according to claim 1, in which the diamond layer is electrically non-conductive.

23. The coated body according to claim 1, wherein:
the hard material layer is composed of one or more metallic elements and one or more non-metallic elements;
wherein the metallic element, or the metallic elements, are selected from the group comprising Al, Si, and elements of Groups 4 to 6 of the Periodic System according to IUPAC (1988);
and wherein the non-metallic element, or non-metallic elements, are selected from the group comprising B, C, N, and O.

24. The coated body according to claim 1, in which:
the hard material layer is formed of one or a plurality of sublayers;
and at least one sublayer is comprised of Ti—Al—N, Ti—N, Ti—C—N, Ti—Al—C—N, Ti—Al—Si—N, Ti—Si—N, Al—Cr—N, Al—Cr—Si—N, and/or Ti—B.

25. The coated body according to claim 1, in which the hard material layer comprises at least one un-doped or metal-doped DLC sublayer.

26. The coated body according to claim 1, in which a metallic intermediate layer is provided between the substrate and the diamond layer, which intermediate layer is comprised primarily of atoms of the elements Cr, W, and/or Ti.

27. A method for coating a body, in which:
a diamond layer is applied over a substrate by means of a CVD process;
and at least one hard material layer with at least one metallic element is applied over the diamond layer, by means of a PVD method;
wherein an adhesive layer is produced between the diamond layer and the hard material layer, in that, prior to the application of the hard material layer, the surface of the diamond layer is pretreated by HIPIMS metal ion etching, wherein ions are implanted and/or are caused to diffuse into the surface of the diamond layer.

28. The method according to claim 27, in which the surface of the diamond layer is treated with Ti ions, during HIPIMS metal ion etching.

29. The method according to claim 27, in which the hard material layer is applied by means of magnetron sputtering, wherein at least one magnetron cathode is operated according to the HIPIMS method.

30. The method according to claim 27, in which:
before the diamond layer is applied, an intermediate layer is applied to the substrate;
wherein the intermediate layer is applied by means of magnetron sputtering, wherein at least one magnetron cathode is operated according to the HIPIMS method.

31. The method according to claim 27, in which:
before the diamond layer is applied, an intermediate layer is applied to the substrate;
wherein before the intermediate layer is applied, the substrate is pretreated by means of ion etching, wherein the ions are produced by means of at least one magnetron cathode which is operated according to the HIPIMS method.

* * * * *